United States Patent [19]

Niemirowski et al.

[11] Patent Number: 5,775,752
[45] Date of Patent: Jul. 7, 1998

[54] HOLDER FOR SEMICONDUCTOR WAFER CASSETTES

[76] Inventors: George E. Niemirowski, 1359 Blue Teal, South Lake, Tex. 76092; John M. Harrell, 723 Becky La., Waxahachie, Tex. 75165; Adam F. Niemirowski, P.O. Box 142, Grapevine, Tex. 76099

[21] Appl. No.: 651,995

[22] Filed: May 20, 1996

[51] Int. Cl.⁶ .................................................. B65D 25/28
[52] U.S. Cl. .............................. 294/28; 294/16; 294/131
[58] Field of Search .................... 294/15, 16, 27.1, 294/28, 33, 34, 106, 115, 131; 16/114 R; 118/500, 503, 728; 206/454, 710, 711; 211/41; 220/752, 759

[56] References Cited

U.S. PATENT DOCUMENTS

| | | | |
|---|---|---|---|
| 1,508,837 | 9/1924 | Dippel | 294/16 X |
| 1,592,286 | 7/1926 | Rymarz | 294/28 |
| 2,454,110 | 11/1948 | Weaver | 294/16 X |
| 3,264,027 | 8/1966 | Luther | 294/16 |
| 3,425,732 | 2/1969 | Reich | 294/28 X |
| 3,861,733 | 1/1975 | Vander Mey | 294/16 X |
| 4,195,871 | 4/1980 | Chilton et al. | 294/16 |
| 4,595,222 | 6/1986 | Schumacher | 294/16 |
| 5,029,922 | 7/1991 | DiNapoli et al. | 294/27.1 |

*Primary Examiner*—Johnny D. Cherry
*Attorney, Agent, or Firm*—David H. Judson; Benjamin C. Huang

[57] ABSTRACT

A device for holding a semiconductor wafer cassette to enable manipulation of the cassette during semiconductor manufacturing processes is disclosed. The device includes a shielding plate for enclosing an open face of a semiconductor wafer cassette. A pair of gripping arms are pivotally connected to edges of the shielding plate for grasping the edges of a semiconductor wafer cassette in response to actuation by a trigger and linkage contained within a handle of the device. The trigger actuates the gripping plates between an opened and closed position. When the cassette is gripped, it may be manipulated in the horizontal and vertical directions by an operator using the handle of the device.

15 Claims, 5 Drawing Sheets

HOLDER FOR SEMICONDUCTOR WAFER CASSETTES

TECHNICAL FIELD

The present invention relates to semiconductor manufacturing apparatus, and more particularly to a holding device for moving, manipulating and working with cassettes for containing semiconductor wafers.

BACKGROUND OF THE INVENTION

The production of semiconductor materials requires the manipulation of cassettes containing a large number of semiconductor wafers. Semiconductor wafer cassettes are a standardized device used throughout the semiconductor manufacturing industry for holding and moving a batch of semiconductor wafer material between different machine processes or locations. A cassette of semiconductor wafers represents a large amount of expensive material that must be carefully moved by an operator to avoid destruction or contamination. The cassettes are large and unwieldy containers that are not easily manipulated by an operator trying to move the cassette or insert the cassette into a processing machine.

Present procedures involve the use of hands or narrow plastic handles for moving and manipulating the semiconductor wafer containers. These methods are unsatisfactory for a variety of reasons. First of all, insertion of the semiconductor wafer cassette into process machines involves working in a limited amount of space. Thus, an operator using his hands is limited in his ability to safely insert a cassette within the process machine without damaging the semiconductor materials within the cassette or injuring his hands because of high temperatures or hazardous materials used by a process machine. Manipulation of the cassettes is further hampered by the fact that semiconductor processing occurs in a clean room environment where protective constraints may limit the manner and agility with which an operator can manipulate a semiconductor wafer cassette. Therefore, a need has arisen for an improved apparatus to assist clean room operators in the manipulation and movement of semiconductor wafer cassettes that overcomes the limitations of prior apparatus and methods.

BRIEF SUMMARY OF THE INVENTION

The present invention overcomes the foregoing and other problems with a semiconductor wafer cassette holding device. The device consists of a shielding plate which encloses the open face of a semiconductor wafer cassette to prevent wafers from falling out of the cassette. The plate also acts as a heat shield for an operator's hand who is manipulating the holding device. A plurality of guideposts extend outward from the corners of the shielding plate to assist in guiding the device to a gripping position about the edges of the semiconductor wafer cassette. The upper guideposts may also define a groove for gripping and holding the device on the top edge of a semiconductor wafer cassette.

A pair of gripping plates are pivotally connected to opposing edges of the shielding plate. The gripping plates move between closed and opened positions to grip the edges of a cassette. The gripping plates are actuated by a triggering mechanism contained within the handle of the device. The triggering mechanism consists of a hand actuated trigger that actuates a linkage mechanism for pivoting the gripping plates from the closed to the open position and back again. A locking mechanism within the handle is actuated by a user's thumb to enable movement of the trigger from the closed to the open actuation positions. When locked, the trigger may not be actuated and the gripping plates remain in the closed position. The handle and trigger mechanism also enable the user to manipulate the holder and a held cassette easily in both the horizontal and vertical directions. In an alternative embodiment an additional gripping handle may be added to the top of the handle to assist in manipulation of the holder and a cassette in the horizontal direction.

The foregoing has outlined some of the more pertinent aspects of the present invention. These aspects should be construed merely illustrative of some of the more permanent features and application of the invention. Many other beneficial results can be obtained by applying the disclosed invention in a different manner or modifying the invention as will be described. Accordingly, further aspects and a fuller understanding of the invention may be had by referring to the following detailed description of the preferred embodiment.

BRIEF DESCRIPTION OF THE DRAWINGS

For a more complete understanding of the present invention and the advantages thereof, reference should be made to the following Detailed Description taken in connection with the accompanying drawings in which.

DETAILED DESCRIPTION

Figure 1:
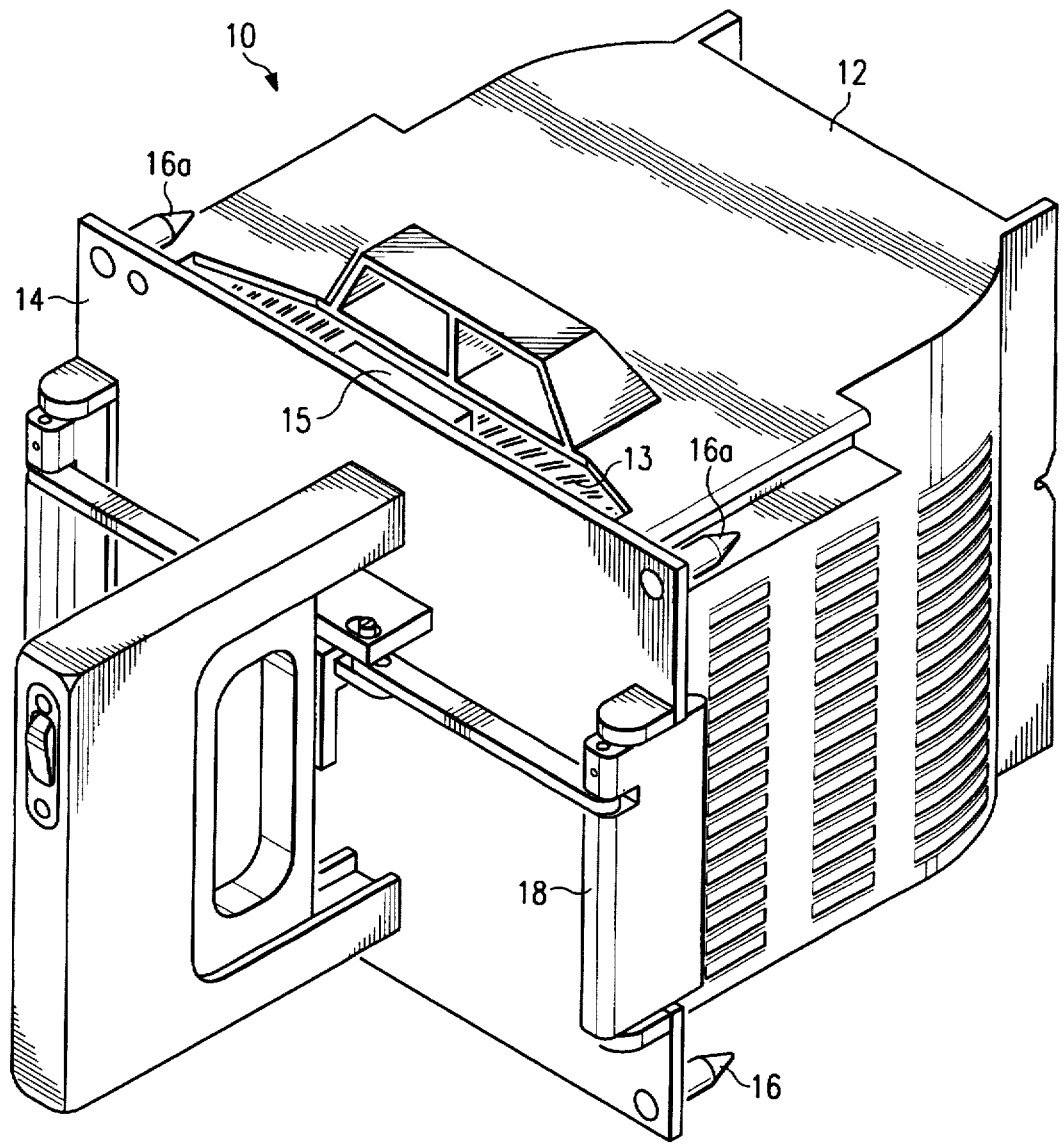
FIG. 1 is a perspective view of the holder connected to a semiconductor wafer cassette.

Referring now to the drawings and more particularly to FIG. 1, there is illustrated a perspective view of the holder mechanism of the present invention. The holder mechanism 10 clamps onto the front surface of a semiconductor wafer cassette 12. The cassette 12 is enclosed on five sides and includes an open front bay 13 for receiving a plurality of semiconductor wafers inserted into shelves (not shown) defined on the interior of the cassette.

The holder mechanism 10 includes a shield plate 14 for enclosing the open face of the semiconductor wafer cassette 12. A retaining bar 15 (shown in phantom) may be mounted to the shield plate 14 to maintain the semiconductor wafers within the interior shelves of the cassette 12. The shield plate 14 is preferably constructed of a static dissipative, semiconductor acceptable material to prevent static discharge and contamination to the semiconductor wafers. The holder mechanism 10 is guided into place on the semiconductor wafer cassette 12 by four guideposts 16 located near each corner of the shield plate 14. The guideposts 16 are located to direct the holding mechanism 10 to a position for gripping the edges of the semiconductor wafer cassette 12.

Figure 2:
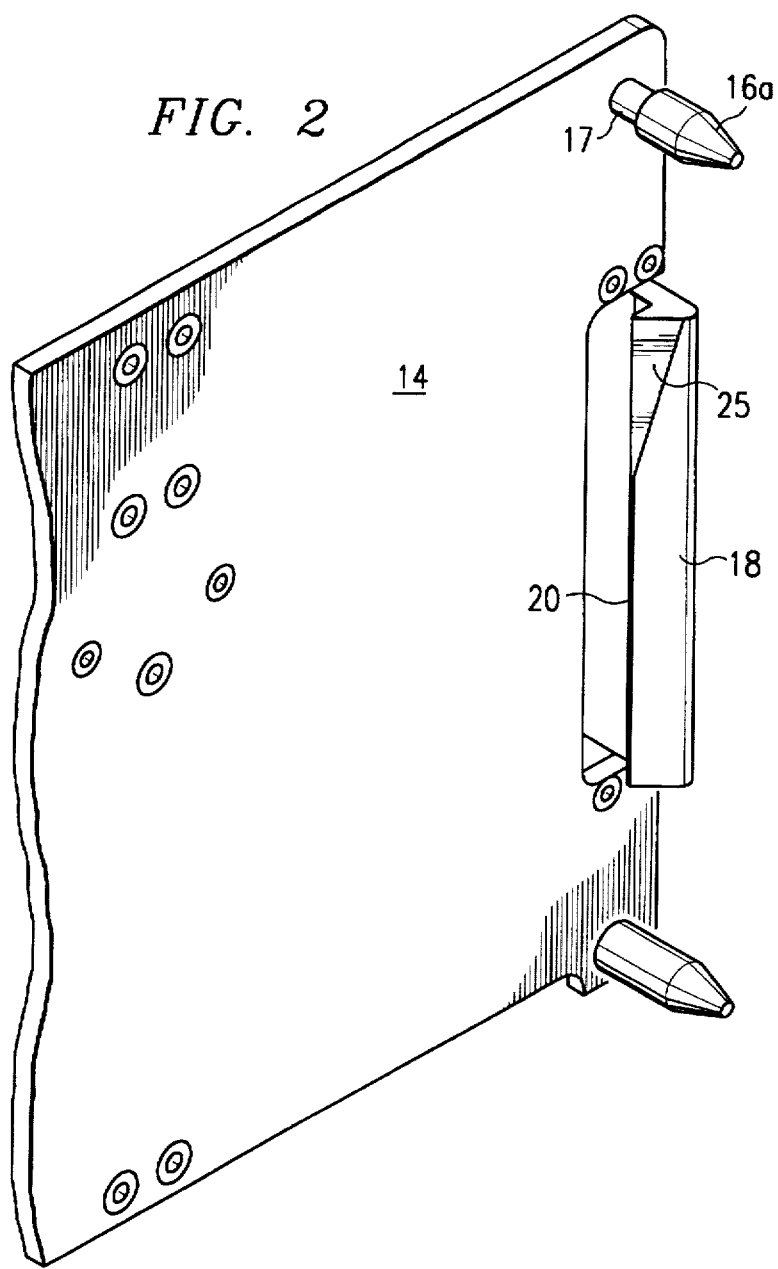
FIG. 2 is an alternative embodiment of the upper guideposts of the holder having automatic latches.

Referring also to FIG. 2 the upper guideposts 16a further includes a grooved channel 17 located at its base adjacent to the shielding plate 14. This grooved channel 17 facilitates gripping the top edge of a semiconductor wafer cassette 12 such that the holding mechanism 10 may be placed on the front surface of a semiconductor wafer cassette and held in place without actually gripping the side edges of the cassette.

Figure 3:
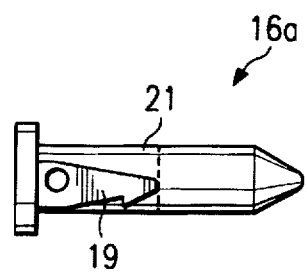
FIG. 3 is an alternative embodiment of the upper guideposts of the holder having automatic latches.

FIG. 3 illustrates an alternative embodiment of the upper guidepost 16a wherein the guidepost includes a latching arm 19 pivotally connected within a chamber 21 in the interior of the guideposts 16a. The chamber 21 faces downward such that the latching arm would automatically swing downward to lock over an edge of the semiconductor wafer cassette 12 when the guideposts 16a are directed horizontally. The latching arm 19 will be balanced in such a manner that when the guideposts are in a vertical position, the arm swings back into the interior chamber 21 releasing the latched edge of the cassette 12.

Referring back to FIGS. 2 AND 4, a pair of gripping plates 18 are pivotally connected to the side edges of the shielding plate 14 to grip opposing edges of the semiconductor wafer cassette 12. The gripping plate 18 comprises a substantially rectangular plate defining a retaining edge 20 on one side thereof. The retaining edge 20 grasps the edge of cassette 12 and holds it against the surface of the shielding plate 14. In this manner, the cassette 12 is firmly held to the shielding plate 14 to enable movement of the cassette and to prevent displacement of the semiconductor wafers within the cassette. The gripping plates 18 are pivotally mounted to the shield plate 14 via a pivot shaft (not shown). The gripping plates 18 also include an angled surface 25. The purpose of this surface is to facilitate the shielding plate 14 and holding mechanism 10 lying as close as possible to the open face of the cassette 12 when an upper edge of the cassette is grasped by the grooved channel 17 of the upper guideposts 16a as described above.

Figure 4:
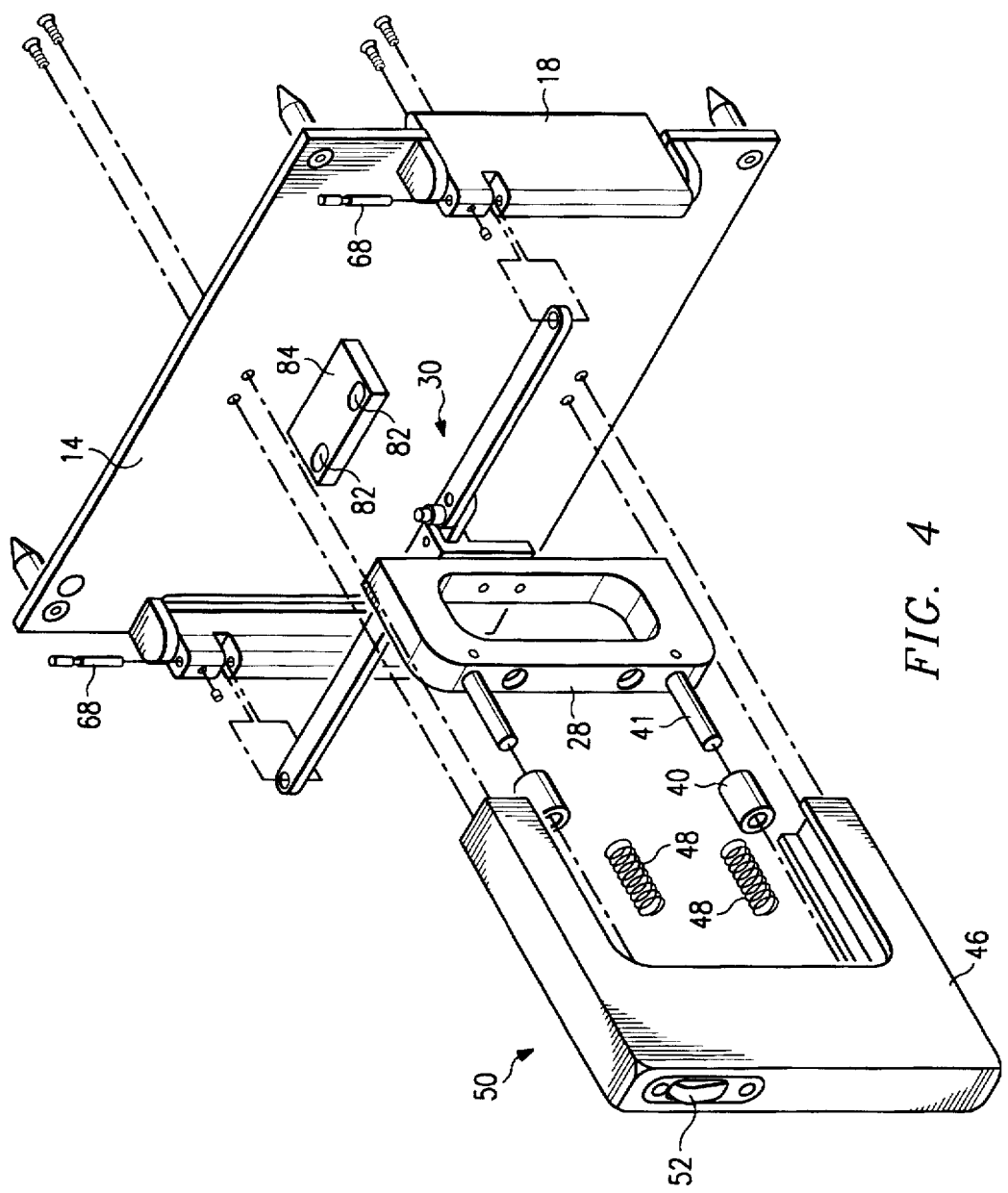
FIG. 4 is an exploded perspective view of the holder.
Figure 5:
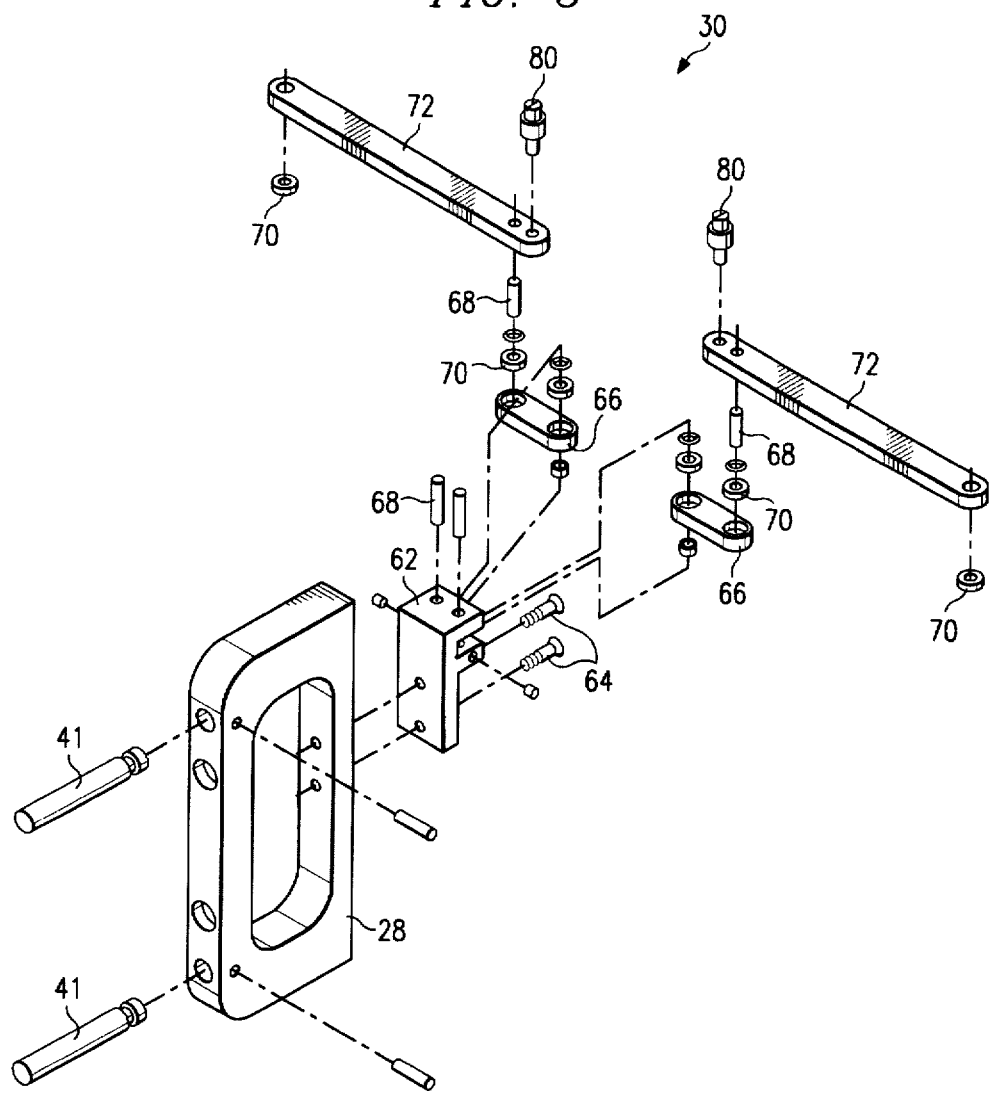
FIG. 5 is an exploded perspective view of the trigger and linkage mechanism.

Referring now to FIGS. 4 and 5, the gripper plates 18 are actuated via a spring loaded trigger 28 and trigger linkage. The trigger 28 is mounted on a pair of linear bearings 40 which are specially coated with Frelon®, a chemical combination of Teflon® and fillers. The trigger 28 rides along the linear bushings 40 and shafts 41 through guide holes in the handle 46 and is forced outward from the base of the handle via a plurality of springs 48 resting between the trigger and handle.

The thumb latch mechanism 50 prevents the trigger 28 from moving between closed and open actuation positions. The closed position corresponds to a closed state for the gripping plates while the open position corresponds to an open state for the gripping plates. The thumb lock mechanism 50 includes an actuation pad 52 and blocking arm 54 (FIG. 6) pivoting about a shaft 56. The blocking arm 54 when in the closed position blocks one of the linear shafts 41 so that the trigger 28 may not be actuated to the open position. When the thumb lock mechanism 50 is actuated to the open position, the blocking arm 54 lowers out of a blocking position enabling the linear shafts 41 and trigger 28 to move rearward thus opening the gripper plates 18. When no pressure is placed on the actuator pad 52, the blocking arm returns to the closed position to lock the gripper plates 18 in place.

The trigger linkage 30 consists of a pair of dual linkage arms interconnecting the trigger 28 and gripper plates 18. The use of dual linkage arms enables a shorter trigger pull to be utilized to open the gripper plates 18 to a sufficient width to grasp the edges of the semiconductor wafer cassette 12 while not opening them so far as to interfere with the limited spaces in which cassettes are inserted in process machinery. The trigger linkage 30 consists of a pulling bracket 62 mounted to the base of the trigger 28 via a pair of bolts 64. The pulling bracket 62 is pivotally connected to a first end of a first pair of linkage arms 66 via a pivot shaft 68 and bearing bushing 70. The first pair of linkage arms 66 are pivotally connected to a second pair of linkage arms 72 via a similar shaft 68 and bearing bushing 70 connection. The second end of the second pair of linkage arms 72 pivotally engage an edge of a gripper plate 18 to actuate the movement between the open and closed positions. The second linkage arms 72 are pivotally connected with the gripping arms 18 via a shaft 68 and bearing bushing 70 as described previously.

At a point substantially near the connection of the first and second linkage arms there is connected a cam 80 for engaging a slot 82 within stopping plate 84. The stopping plate 84 is mounted to the rear of shield plate 14 and performs the dual functions of stopping the forward movement of the trigger 28 and controlling movement of the trigger linkage 30. When a force is exerted on the first and second linkage arms by the trigger 28, the cam 80 and slot 82 force the second linkage arms to move toward the center of the shielding plate 14. This causes the pivotal connection between the second linkage arms and the gripping plate 18 to pivot the gripper plates from the closed to the open position.

Each of the pivotally connected points including a shaft 68 and bearing bushing 70 include ball bearings with the bearing shaft to facilitate smooth rotation about the shaft. This is due to the fact that the use of the holding apparatus in a clean room environment requires that microscopic particulate matter be minimized. Bearingless bushings create friction between the shaft and bushing that generates particulate matter. This particulate matter can contaminate semiconductor materials.

Figure 6:
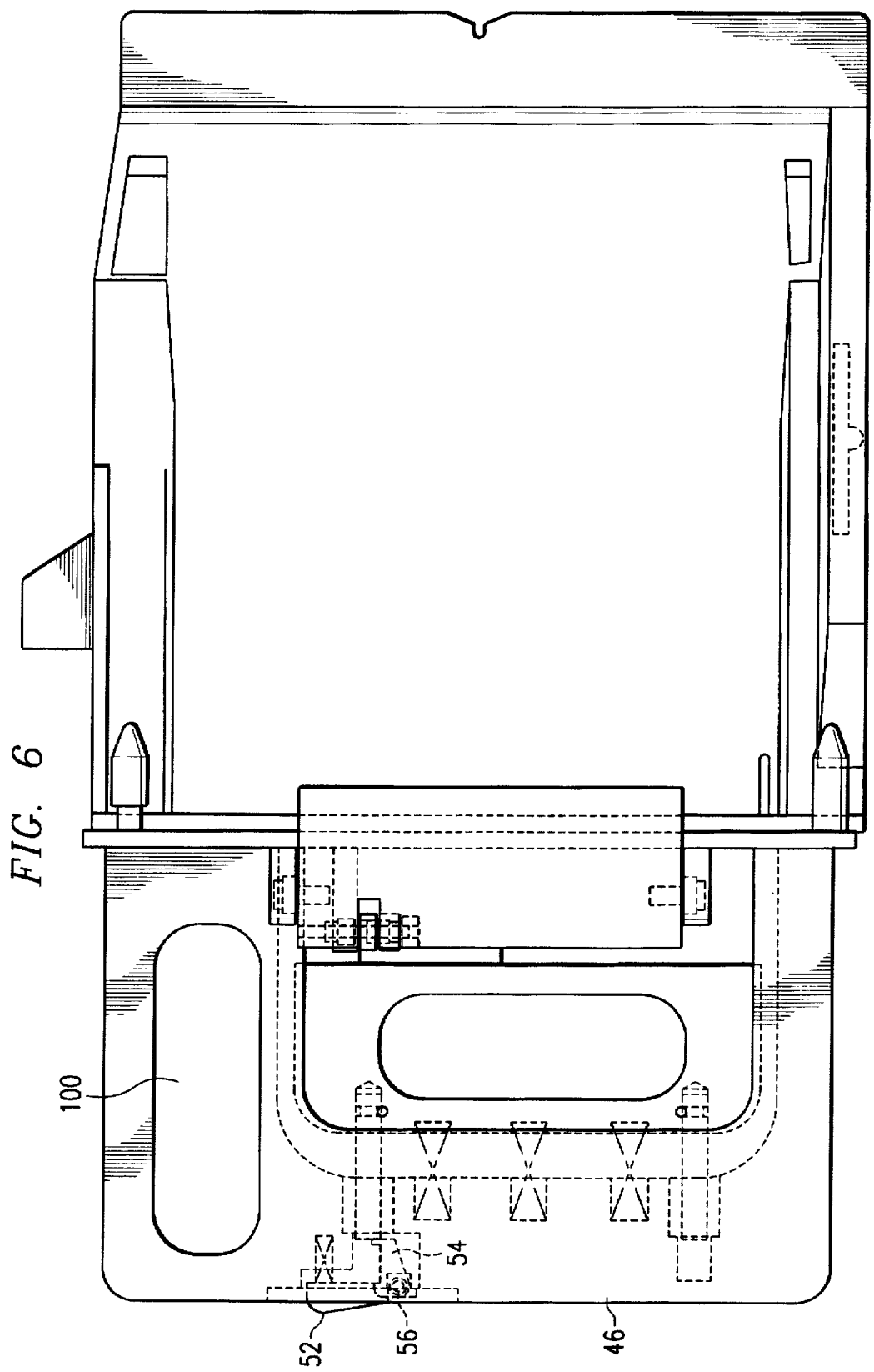
FIG. 6 is a side view of an alternative embodiment of the handle of the holder.

Referring now to FIG. 6, there is illustrated an alternative embodiment of the handle 46 of the present invention. The alternative embodiment includes a second gripping slot 100 within the handle 46 to facilitate manipulation of the holding mechanism in the horizontal direction when a semiconductor wafer cassette is gripped. This arrangement permits an operator to have more control over the weight of the cassette which would tend to cause the cassette to rotate downward toward the ground when the cassette is manipulated horizontally.

It should be appreciated by those skilled in the art that the specific embodiments disclosed above may be readily utilized as a basis for modifying or designing other structures for carrying out the purposes of the present invention. It should also be realized by those skilled in the art that such equivalent constructions do not depart from the spirit and scope of the invention as set forth in the appended claims.

What is claimed is:

1. An apparatus for holding a semiconductor wafer cassette comprising:

a pair of gripping plates for holding opposing edges of an open face semiconductor wafer cassette;

means for actuating the pair of gripping plates between a first position and a second position;

means for locking the gripping plates in a first position corresponding to a closed position of the gripping plates;

a handle connected to the means for actuating enabling manipulation of a held semiconductor wafer cassette in both horizontal and vertical directions; and a shielding plate for enclosing the open face of the semiconductor wafer cassette wherein the pair of gripping plates are pivotally connected to opposing edges of the shielding plate.

2. The apparatus of claim 1 further including a plurality of guideposts mounted to a first side of the shielding plate to guide the pair of gripping plates into a location for grasping the opposing edges of the semiconductor wafer cassette.

3. The apparatus of claim 1 further including a guide bar on a first side of the shielding plate for keeping semiconductor wafers seated within the semiconductor wafer cassette.

4. The apparatus of claim 1 wherein the means for actuating further includes:

a trigger for actuating the pair of gripping plates between the first position and the second position; and linkage means responsive to the trigger for pivoting the gripping plates between the first position and the second position.

5. The apparatus of claim 4 wherein the linkage means further includes:

a pair of first arms having first ends pivotally connected to the trigger;

a pair of second arms having first ends pivotally connected to second ends of the pair of first arms and second ends pivotally connected to the gripping plates.

6. The apparatus of claim 4 further including means for locking the trigger in a first position corresponding to a closed position of the gripping plates.

7. The apparatus of claim 1 wherein the handle further defines a handhold for assisting in manipulation of the semiconductor wafer cassette in the horizontal direction.

8. An apparatus for holding a semiconductor wafer cassette comprising:

a shielding plate for enclosing an open face of the semiconductor wafer cassette a pair of gripping plates pivotally connected to the shielding plate for holding edges of the open face of the semiconductor wafer cassette;

means for actuating the pair of gripping plates between a closed position and an open position;

a handle connected to the shielding plate enabling manipulation of a held semiconductor wafer cassette in both horizontal and vertical directions and a guidepost located at each corner of the shielding plate on a first side thereof for guiding the pair of gripping plates into a location for gripping edges of the semiconductor wafer cassette.

9. The apparatus of claim 8 wherein the guideposts on upper corners of the shield plate include a pivoting latch within the interior of the guidepost for latching to an edge of the semiconductor wafer cassette.

10. The apparatus of claim 8 wherein the guideposts on the upper corners of the shield plate define grooves for resting on an edge of the cassette when the gripping plates are not gripping the edges of the cassette.

11. The apparatus of claim 8 wherein the gripping plates further define an angled portion enabling the shielding plate to rest closer to the open face of the cassette when the gripping plates are not gripping the edges of the cassette.

12. The apparatus of claim 8 further including a guide bar on the first side of the shielding plate for keeping semiconductor materials seated within the semiconductor wafer cassette.

13. The apparatus of claim 8 wherein the means for actuating further includes:

a trigger for actuating the pair of gripping plates between the closed position and the open position; and linkage means responsive to the trigger for pivoting the gripping plates between the closed position and the open position.

14. The apparatus of claim 13 wherein the linkage means further includes:

a pair of first arms having first ends pivotally connected to the trigger;

a pair of second arms having first ends pivotally connected to second ends of the pair of first arms and second ends pivotally connected to the gripping plates.

15. The apparatus of claim 8 wherein the handle further defines a handhold for assisting in manipulation of the semiconductor wafer cassette in the horizontal direction.

* * * * *